United States Patent
Chiu et al.

(10) Patent No.: US 7,407,820 B2
(45) Date of Patent: Aug. 5, 2008

(54) METHOD FOR MONITORING OXIDE FILM DEPOSITION

(75) Inventors: Mao-Chan Chiu, Taipei (TW); May-Jun Chou, Hsin-Chu (TW); Ching-Tang Wang, Hsin-Chu (TW); Keng-Hui Su, Hsin-Chu (TW)

(73) Assignee: Macronix International Co., Ltd., Hsin-Chu (TW)

( * ) Notice: Subject to any disclaimer, the term of this patent is extended or adjusted under 35 U.S.C. 154(b) by 341 days.

(21) Appl. No.: 11/052,806

(22) Filed: Feb. 9, 2005

(65) Prior Publication Data

US 2006/0177949 A1 Aug. 10, 2006

(51) Int. Cl.
*H01L 21/469* (2006.01)
(52) U.S. Cl. .......... 438/14; 438/264; 438/786; 438/E21.21; 438/E21.267
(58) Field of Classification Search .......... 438/14, 438/264, 786, 791, E21.21, E21.267
See application file for complete search history.

(56) References Cited

U.S. PATENT DOCUMENTS

| 6,339,000 | B1 * | 1/2002 | Bhattacharya et al. ...... 438/261 |
| 6,528,433 | B2 * | 3/2003 | Gartner et al. ............. 438/786 |
| 2005/0124081 | A1 * | 6/2005 | Ishii et al. ..................... 438/14 |

OTHER PUBLICATIONS

S. Wolf, Silicon Processing for the VLSI Era, 1990, Lattice Press, vol. 2, 621-638.*

* cited by examiner

*Primary Examiner*—Minh-Loan T Tran

(57) ABSTRACT

A method for monitoring oxide film deposition is disclosed. The method utilizes monitor wafers having silicon nitride films thereon instead of bare wafers to monitor the growth of silicon oxide films in a furnace. The method for monitoring oxide film deposition includes the following steps. First of all, a monitor wafer having silicon nitride film and a process wafer are provided. Next an oxide layer is formed on the monitor wafer and the process wafer, and the thickness of the oxide layer is controlled substantially equally on the monitor wafer and the process wafer. Then the thickness of the oxide layer on the monitor wafer and the process wafer is measured.

14 Claims, 3 Drawing Sheets

METHOD FOR MONITORING OXIDE FILM DEPOSITION

BACKGROUND OF THE INVENTION

1. Field of the Invention

The present invention relates to a method for monitoring oxide film deposition, and more particularly to a method for monitoring high temperature oxide (HTO) film deposition in a vertical HTO furnace.

2. Description of the Related Art

In the semiconductor industry, the oxide film deposition process which is performed in a vertical furnace has several issues to be solved. For example, as shown in FIG. 1A, the oxide film deposition process is used to form the silicon oxide films 51, 53 of an oxide-nitride-oxide (ONO) stack layers 55 of a semiconductor device 50. There is a nitride film 52 between the oxide film 51 and the oxide film 53. The semiconductor device 50 can be a non-volatile memory device or a flash memory device. However, the thickness of the oxide films 51, 53 formed on wafers which are loaded on different locations of the vertical furnace would vary due to the characteristics of the vertical furnace. To solve this problem, the wafer loading sequence between the depositions of the top oxide film 53 and the bottom oxide film 51 of the ONO stack layers 55 is reversed to balance the variation of thickness of the ONO stack layer.

Since the thickness of the oxide film is a crucial dimension for the semiconductor device 50 such as a non-volatile memory device or a flash memory device, monitoring the oxide film deposition is inevitable. In order to monitor the deposition of the oxide film, monitor wafers are utilized to measure the growth rate of the oxide film deposition. However, the conventional monitoring method has a troubling drawback. As shown in FIG. 1B, the monitor wafers 100a, 100b and 100c having native oxide films 102a, 102b and 102c thereon are located on the top, middle and bottom locations inside a furnace 300 respectively. A plurality of process wafers 400 are loaded together into the furnace 300 to form oxide films. The native oxide films 104a, 104b and 104c are formed during the wafer loading process. The variation of the thicknesses of native oxide films 104a, 104b and 104c generally results from the air flow brought into the furnace 300 during the wafer loading process and the different locations inside the furnace 300. After the wafer loading process, the furnace 300 is closed and starts to grow oxide films 106a, 106b and 106c on the native oxide films 104a, 104b and 104c. Because the native oxide films formed on the monitor wafers 100a, 100b and 100c are not well controlled, the growth rate of the oxide film deposition on the monitor wafers 100a, 100b and 100c would mislead the setting of the oxide film deposition process and result in wrong thickness of oxide films 51, 53 of the semiconductor device 50 such as a flash memory device deviate the predetermined value and unstable electrical characteristics of the semiconductor device 50.

In view of the drawbacks mentioned with the prior art, there is a continued need to develop a new and improved method for monitoring oxide film deposition that overcomes the disadvantages associated with prior art. The requirements of this invention are that it solves the problems mentioned above.

BRIEF SUMMARY OF THE INVENTION

It is therefore an object of the invention to provide a method for monitoring oxide film deposition to improve the process stability and enhance the yield performance.

It is another object of this invention to provide a method for monitoring oxide film deposition to simplify the production flow.

It is a further object of this invention to provide a method for monitoring oxide film deposition to monitor the actual thickness of the oxide film on a process wafer.

It is a further object of this invention to provide a method for monitoring oxide film deposition to get constant thicknesses of the oxide films on the different locations inside a furnace.

To achieve these objects, and in accordance with the purpose of the invention, the invention provides a method for monitoring oxide film deposition. The method comprises the following steps. At least one monitor wafer having a silicon nitride film thereon is provided. Then the monitor wafer together with at least one process wafer is loaded into a furnace to monitor the growth of an oxide film on the process wafer.

In another embodiment of the invention, the method comprises the following steps. First of all, at least one first monitor wafer having a first silicon nitride film thereon is provided. Then the monitor wafer together with at least one process wafer are loaded into a furnace to monitor the growth of a first oxide film on the process wafer. Next the process wafer and the monitor wafer are removed from the furnace. Then second silicon nitride films are formed on the process wafer. Finally, at least one second monitor wafer together with the process wafer are loaded into the furnace to monitor the growth of a second oxide film on the process wafer.

It is to be understood that both the foregoing general description and the following detailed description are exemplary and explanatory only and are not restrictive of the invention, as claimed.

BRIEF DESCRIPTION OF THE DRAWINGS

The present invention is best understood by reference to the following detailed description when read in conjunction with the accompanying drawings.

Common reference numerals are used throughout the drawings and detailed descriptions to indicate like elements.

DETAILED DESCRIPTION OF THE INVENTION

It is to be understood and appreciated that the structures described below do not cover a complete structure. The present invention can be practiced in conjunction with various fabrication techniques that are used in the art, and only so much of the commonly elements are included herein as are necessary to provide an understanding of the present invention.

According to the characteristics of the silicon oxide process, native oxide films are hardly formed on the surface of a nitride film at a temperature over 800° C., monitor wafers with nitride films are used to monitor the growth of oxide films on process wafers in a furnace.

Figure 2:
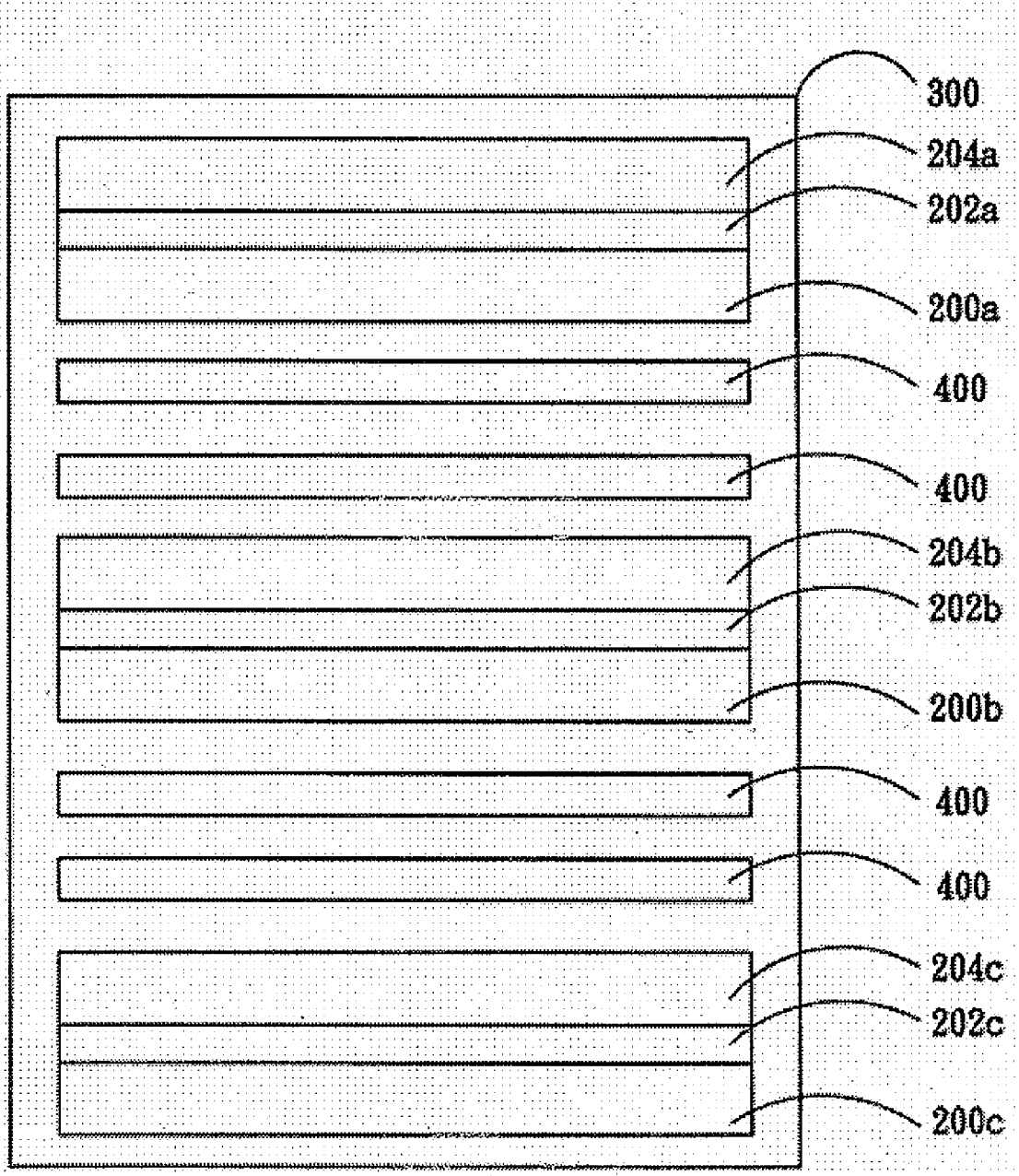
FIG. 2 shows monitor wafers 200a, 200b and 200c having silicon nitride and silicon oxide films thereon located on the top, middle and bottom inside a furnace 300 respectively.

As shown in FIG. 2, monitor wafers 200a, 200b and 200c having silicon nitride films 202a, 202b and 202c thereon are located on the top, middle and bottom locations inside a furnace 300 respectively. The furnace 300 preferably comprises a vertical high temperature oxidation furnace. The silicon nitride films 202a, 202b and 202c are formed on the monitor wafers 200a, 200b and 200c to prevent the formation of any native oxide films on the monitor wafers 200a, 200b and 200c before the wafer loading process. The silicon nitride films 202a, 202b and 202c can be formed by many processes known in the art, such as chemical vapor deposition processes. The thicknesses of the silicon nitride films 202a, 202b and 202c are preferably the same thickness for the purpose of monitoring oxide growth. A plurality of process wafers 400 are loaded together into the furnace 300 to form silicon oxide films. The thicknesses of the silicon oxide films 204a, 204b, 204c and the oxide films on the process wafers 400 are controlled to be substantially equal. Then the thickness of the silicon oxide films 204a, 204b and 204c is measured.

Figure 1A:
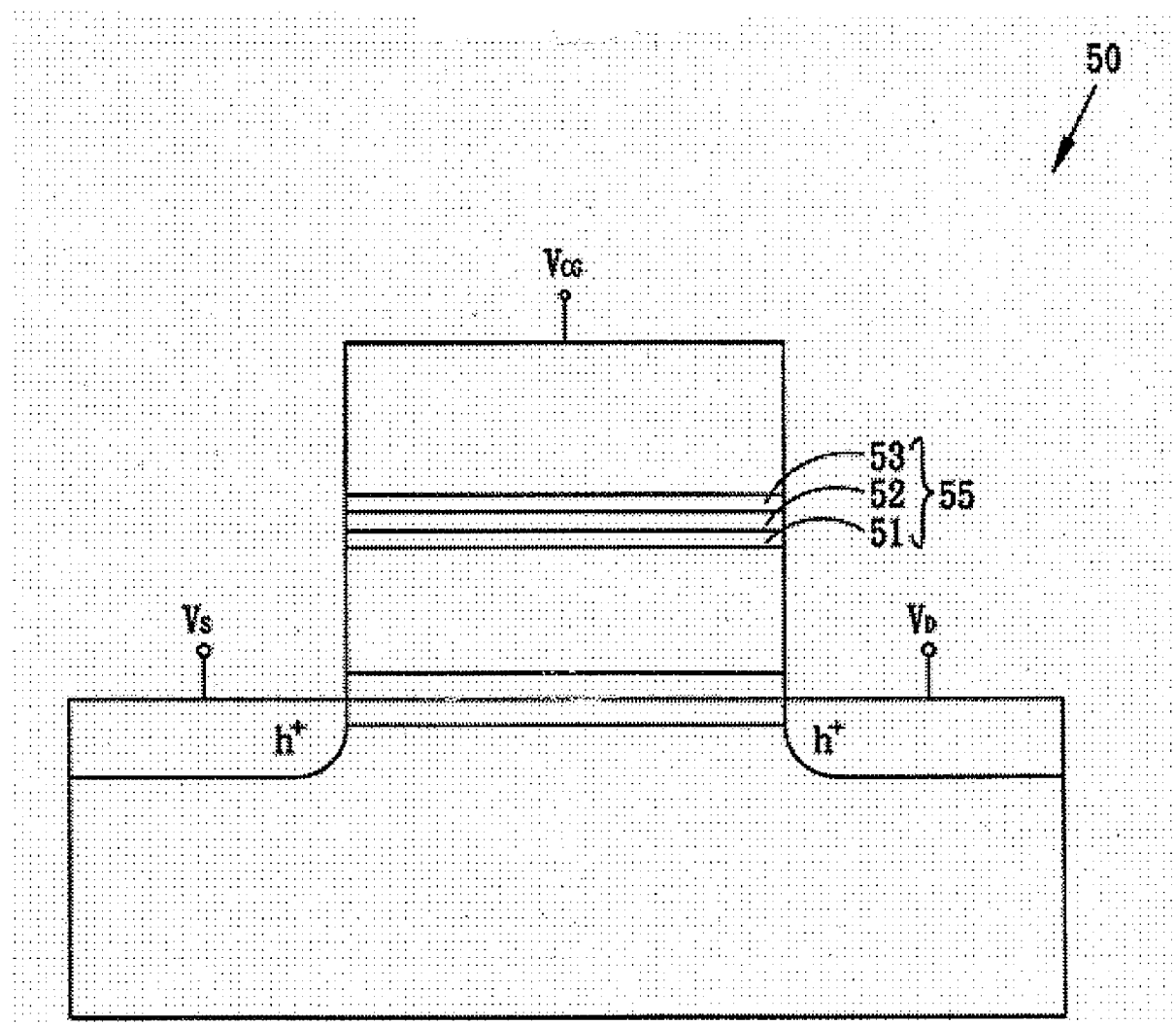
FIG. 1A shows the silicon oxide films 51, 53 of an oxide-nitride-oxide (ONO) stack layers 55 of a semiconductor device 50.
Figure 1B:
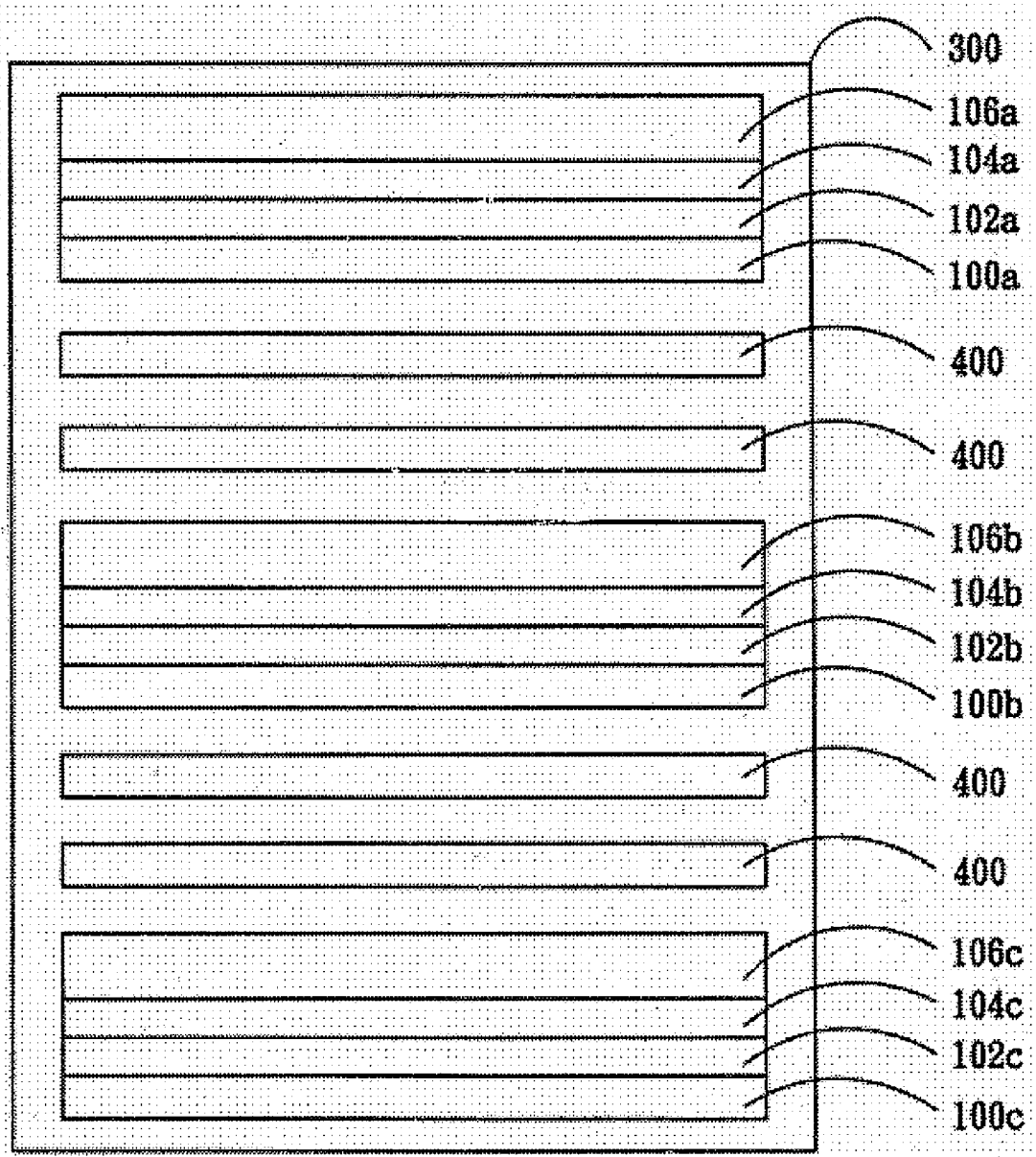
FIG. 1B shows monitor wafers 100a, 100b and 100c having oxide films thereon located on the top, middle and bottom locations inside a furnace 300 respectively.

When the monitor wafers having silicon nitride films thereon are used to monitor the oxide deposition of the semiconductor device 50 such as shown in FIG. 1A, the method for monitoring oxide film deposition comprises the following steps. First monitor wafers having first silicon nitride films thereon are loaded together with process wafers into a furnace to deposit first silicon oxide films on the first monitor wafers and the process wafers, and the thickness of the first oxide films are controlled substantially equally on the monitor wafers and the process wafers. After the first silicon oxide films are formed on the process wafers and the monitor wafers, the process wafers and the first monitor wafers are removed from the furnace. Then the thickness of the first oxide films is measured. Then second silicon nitride films are formed on the process wafers. The second silicon nitride films can be formed by chemical vapor deposition processes. Next second monitor wafers having third silicon nitride films thereon together with the process wafers are loaded into the furnace to deposit second silicon oxide films on the process wafers, and the thickness of the second oxide films are controlled substantially equally on the second monitor wafers and the process wafers. Then the thickness of the second silicon oxide films is measured. The first silicon oxide films, second silicon nitride films and the second silicon oxide films on the process wafers are oxide-nitride-oxide stack of the non-volatile memory device such as a flash memory device.

The advantages of the invention includes the followings. First of all, in the process of non-volatile memory devices, the wafer loading sequence between the depositions of the top oxide film and the bottom oxide film of an ONO stack layer is not necessary to be reversed to balance the variation of thickness of the ONO stack layer. The production arrangement involving oxide film deposition can be improved. Moreover, the thicknesses of silicon oxide films on the process wafers are equal to the thicknesses of silicon oxide films formed on the monitor wafers disregarding the wafer loading process and the characteristics of a furnace.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method for monitoring oxide film deposition on a process wafer, the method comprising:

providing at least one monitor wafer having a silicon nitride film thereon, wherein the silicon nitride film can prevent the forming of a native oxide film;

loading said at least one monitor wafer together with at least one said process wafer into a furnace;

depositing an oxide film on said at least one monitor wafer and said process wafer; and monitoring oxide film deposition on said process wafer by measuring the thickness of the oxide film on said at least one monitor wafer.

2. The method for monitoring oxide film deposition according to claim 1, wherein three said monitor wafers are loaded together with said at least one process wafer into said furnace and are located at top, middle and bottom inside said furnace respectively.

3. The method for monitoring oxide film deposition according to claim 1, wherein said furnace comprises a vertical high temperature oxide furnace.

4. The method for monitoring oxide film deposition according to claim 1, wherein said oxide film grows at a temperature over 800° C.

5. The method for monitoring oxide film deposition according to claim 1, wherein said oxide film is formed on a nitride film on said at least one process wafer as a top oxide film of an oxide-nitride-oxide stack.

6. The method for monitoring oxide film deposition according to claim 1, wherein said at least one process wafer is for a process of making a plurality of non-volatile memory devices.

7. The method for monitoring oxide film deposition according to claim 6, wherein said non-volatile memory device comprises a flash memory device.

8. A method for monitoring oxide film deposition on a process wafer, the method comprising:

providing at least one first monitor wafer having a first silicon nitride film thereon wherein the first silicon nitride film can prevent the forming of a native oxide film on said at least one first monitor wafer;

loading said at least one first monitor wafer together with at least one said process wafer into a furnace;

depositing an oxide film on said at least one first monitor wafer and said process wafer;

removing said process wafer and said at least one first monitor wafer from said furnace;

monitoring oxide film deposition on said process wafer by measuring the thickness of the oxide film on said at least one first monitor wafer;

forming a second silicon nitride film on said at least one process wafer; and loading at least one second monitor wafer having a third silicon nitride film thereon together with said at least one process wafer into said furnace to monitor the growth of a second oxide film on said at least one process wafer, wherein the third silicon nitride film can prevent the forming of a native oxide film on said at least one second monitor wafer.

9. The method for monitoring oxide film deposition according to claim 8, wherein three said first monitor wafers are loaded together with said at least one process wafer into said furnace and are located at top, middle and bottom inside said furnace respectively.

10. The method for monitoring oxide film deposition according to claim 8, wherein said furnace comprises a vertical high temperature oxide furnace.

11. The method for monitoring oxide film deposition according to claim 8, wherein said oxide film grows at a temperature over 800° C.

12. The method for monitoring oxide film deposition according to claim 8, wherein said process wafer is for a process of making a plurality of non-volatile memory devices.

13. The method for monitoring oxide film deposition according to claim 12, wherein said non-volatile memory device comprises a flash memory device.

14. The method for monitoring oxide film deposition according to claim 8, wherein three said second monitor wafers are loaded together with said silicon process wafers into said furnace and are located at top, middle and bottom inside said furnace respectively.

* * * * *